United States Patent
Ikuyama et al.

(10) Patent No.: US 11,671,089 B2
(45) Date of Patent: Jun. 6, 2023

(54) LOAD DRIVER

(71) Applicant: HITACHI ASTEMO, LTD., Hitachinaka (JP)

(72) Inventors: Takeshi Ikuyama, Hitachinaka (JP); Koichi Yahata, Hitachinaka (JP)

(73) Assignee: HITACHI ASTEMO, LTD., Hitachinaka (JP)

( * ) Notice: Subject to any disclaimer, the term of this patent is extended or adjusted under 35 U.S.C. 154(b) by 46 days.

(21) Appl. No.: 17/603,059

(22) PCT Filed: Mar. 13, 2020

(86) PCT No.: PCT/JP2020/011014
§ 371 (c)(1),
(2) Date: Oct. 12, 2021

(87) PCT Pub. No.: WO2020/213316
PCT Pub. Date: Oct. 22, 2020

(65) Prior Publication Data
US 2022/0190817 A1    Jun. 16, 2022

(30) Foreign Application Priority Data
Apr. 17, 2019    (JP) .............................. JP2019-078466

(51) Int. Cl.
*H03K 3/00*    (2006.01)
*H03K 17/08*    (2006.01)
(Continued)

(52) U.S. Cl.
CPC ........... *H03K 17/0822* (2013.01); *G01K 7/01* (2013.01); *H03K 17/687* (2013.01)

(58) Field of Classification Search
None
See application file for complete search history.

(56) References Cited

U.S. PATENT DOCUMENTS 8,045,311 B2 * 10/2011 Watanabe .............. H03K 17/18
361/94
8,779,929 B2 * 7/2014 Komatsu ............ H03K 17/0822
361/103
(Continued)

FOREIGN PATENT DOCUMENTS

JP    2004-312924 A    11/2004
JP    2010-536032 A    11/2010
(Continued)

OTHER PUBLICATIONS

International Search Report with English translation and Written Opinion issued in corresponding application No. PCT/JP2020/011014 dated Jun. 16, 2020.

*Primary Examiner* — Kenneth B Wells
(74) *Attorney, Agent, or Firm* — Foley & Lardner LLP

(57) ABSTRACT

Even when a large current is intentionally flowed during a high-temperature conduction of a semiconductor element, there is a problem in that an overcurrent state is detected to stop current. In the present invention, an overcurrent detector 4 detects overcurrent when an input voltage Vin reaches a threshold voltage Vth, and outputs an overcurrent detection signal c to a gate driving unit 3. On the other hand, when a temperature detection signal a and a current control signal b are input, a transistor 52 is conducted, and the input voltage Vin of the overcurrent detector 4 becomes zero. In this case, the input voltage Vin of the overcurrent detector 4 does not reach the threshold voltage Vth. Therefore, the output of the drive signal output from the gate driving unit 3 is not stopped. For this reason, a large current can flow in a drain current Ids.

4 Claims, 5 Drawing Sheets

(51) Int. Cl.
  *H03K 17/082*   (2006.01)
  *H02M 1/08*     (2006.01)
  *G01K 7/01*     (2006.01)
  *H03K 17/687*   (2006.01)

(56) References Cited

U.S. PATENT DOCUMENTS

| | | | |
|---|---|---|---|
| 9,667,061 B2* | 5/2017 | Sekigawa | G08B 21/185 |
| 10,432,080 B2* | 10/2019 | Terashima | H02M 1/32 |
| 11,025,245 B2* | 6/2021 | Hiyama | H03K 17/08 |
| 11,063,422 B2* | 7/2021 | Ichimura | H02H 7/122 |
| 11,201,615 B2* | 12/2021 | Taguchi | H03K 17/0822 |
| 2004/0201935 A1 | 10/2004 | Yamamoto | |
| 2009/0039869 A1 | 2/2009 | Williams | |

FOREIGN PATENT DOCUMENTS

| | | |
|---|---|---|
| JP | 2014-060581 A | 4/2014 |
| JP | 2016-201593 A | 12/2016 |

* cited by examiner

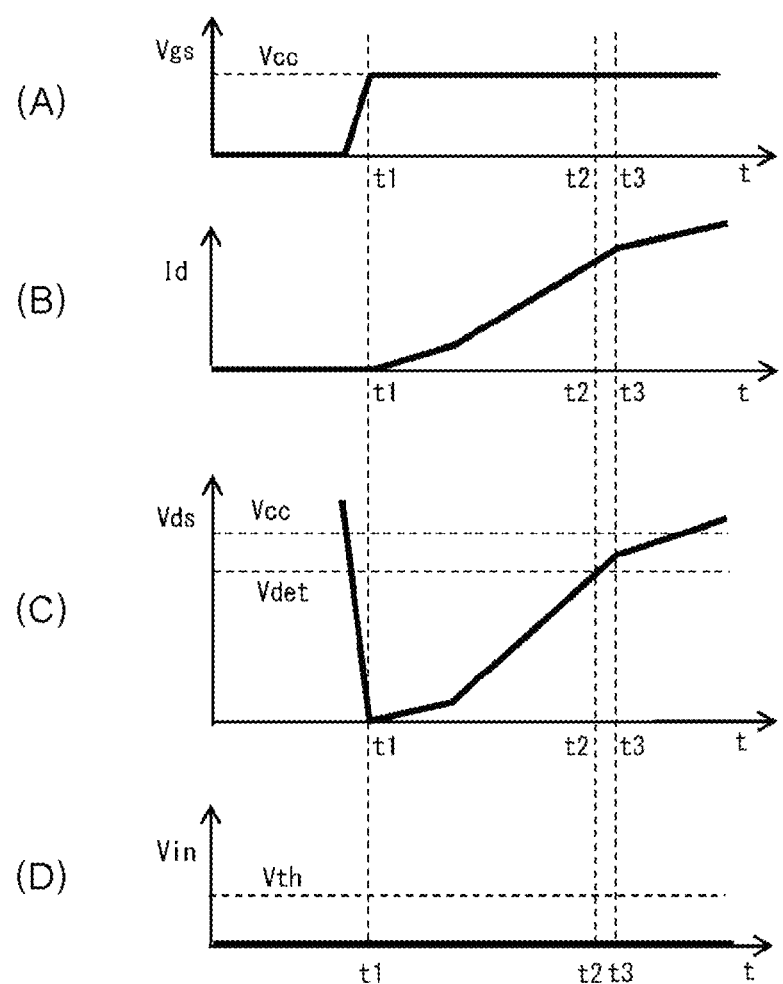

LOAD DRIVER

TECHNICAL FIELD

The present invention relates to a load driver.

BACKGROUND ART

The load driver includes a semiconductor element provided between electrodes, and supplies current to a load by switching control of the semiconductor element. Overcurrent is detected by monitoring a potential difference between the electrodes of the semiconductor element. On the other hand, the semiconductor element such as SiC (silicon carbide) has a characteristic in which a resistance value increases during high-temperature conduction, and voltage between the electrodes greatly increases at a large current.

PTL 1 discloses the load driver that compares a drain-source voltage of the semiconductor element with a predetermined reference voltage and detects an overcurrent state.

CITATION LIST

Patent Literature

PTL 1: JP 2016-201593 A

SUMMARY OF INVENTION

Technical Problem

In the device described in PTL 1 described above, even when a large current is intentionally flowed during the high-temperature conduction of the semiconductor element, there is a problem in that the overcurrent state is detected to stop the current.

Solution to Problem

According to an aspect of the present invention, a load driver includes: a semiconductor element disposed between electrodes through which current flows, the semiconductor element supplying the current during an on-operation and interrupting the current during an off-operation; an overcurrent detector that detects that an input voltage based on voltage between the electrodes is lower than or equal to a threshold voltage; and a voltage changing circuit that changes the input voltage based on the voltage between the electrodes. The voltage changing circuit changes the input voltage to the threshold voltage or less based on a current control signal that allows current higher than or equal to a predetermined value in the semiconductor element and a temperature detection signal indicating that the semiconductor element has temperature higher than or equal to a predetermined value.

Advantageous Effects of Invention

According to the present invention, the large current can be intentionally flowed during the high-temperature conduction of the semiconductor element.

BRIEF DESCRIPTION OF DRAWINGS

FIGS. 5(A) to 5(D) are timing charts illustrating the operation of the load driver when the large current is allowed.

DESCRIPTION OF EMBODIMENTS

Figure 1:
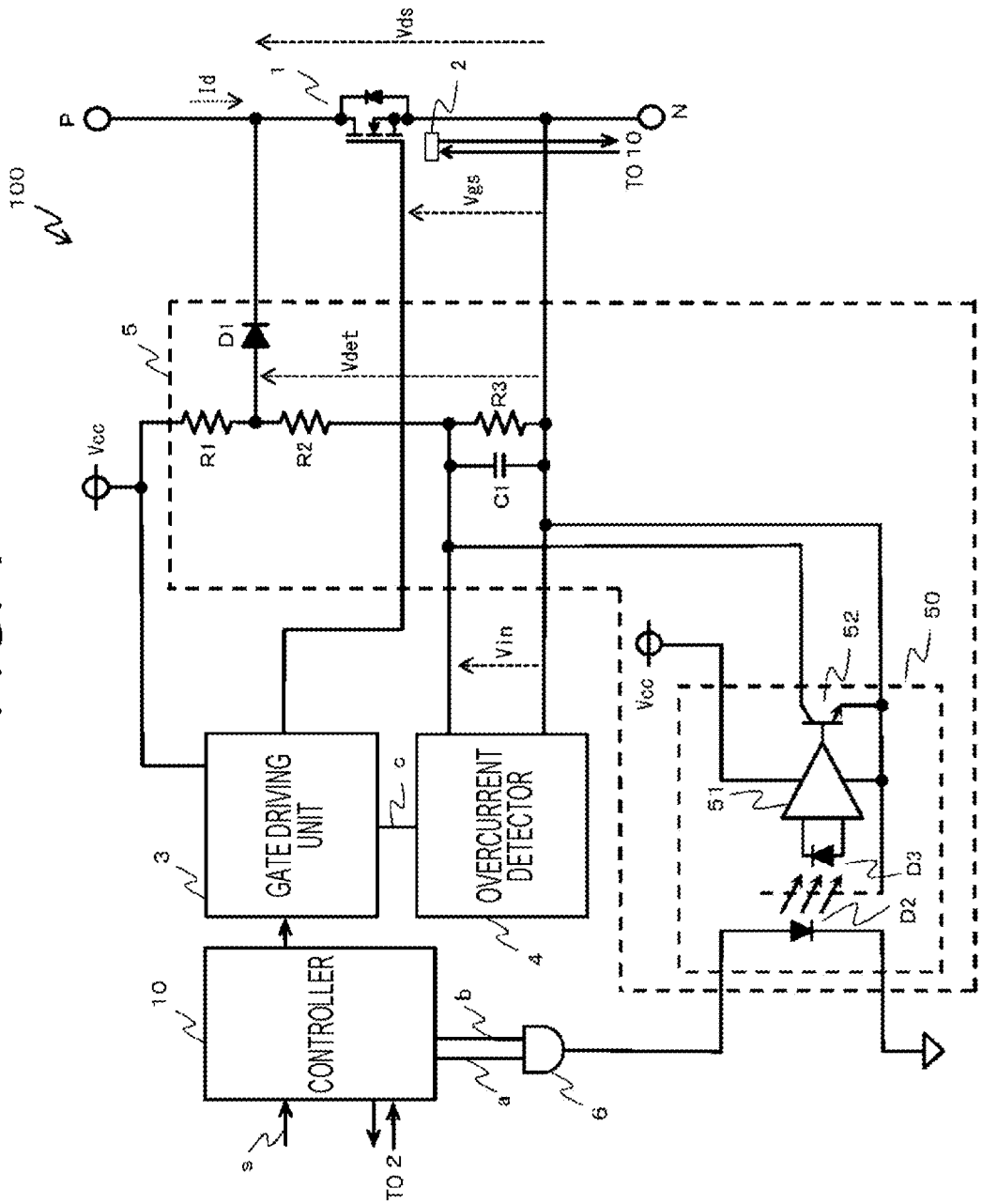
FIG. 1 is a circuit configuration diagram of a load driver.

FIG. 1 is a circuit configuration diagram of a load driver 100.

For example, a semiconductor element 1 is disposed between a positive electrode P and a negative electrode N. The semiconductor element 1 supplies the current during on-operation, and interrupts the current during off-operation. For example, the semiconductor element 1 is one of semiconductor elements constituting an upper and lower arm series circuit of each phase in UVW phases of a three-phase induction motor (motor), and corresponds to an upper arm of each phase or a lower arm of each phase. The upper and lower arm series circuits in the UVW phases constitute an inverter.

A temperature detection element 2 that detects the temperature of the semiconductor element 1 is disposed in a vicinity of the semiconductor element 1. A temperature detection signal from the temperature detection element 2 is input to a controller 10. The controller 10 outputs the temperature detection signal a when a detection signal from the temperature detection element 2 reaches a predetermined value.

Power is supplied from a power supply Vcc to a gate driving unit 3, and the gate driving unit 3 outputs a drive signal to a gate electrode of the semiconductor element 1 in response to a PWM signal or the like from the controller 10. The semiconductor element 1 is turned on when the drive signal is input from the gate driving unit 3.

When an overcurrent detection signal c indicating that overcurrent is detected is input from an overcurrent detector 4 (described later), the gate driving unit 3 stops the output of the drive signal to the semiconductor element 1.

A voltage changing circuit 5 includes a series circuit of resistors R1, R2, R3 to which power is supplied from the power supply Vcc. The connection point between the resistor R1 and the resistor R2 is connected to the side of the positive electrode P of the semiconductor element 1 through a backflow preventing diode D1. The terminal end of the resistor R3 is connected to the side of the negative electrode N of the semiconductor element 1. A capacitor C1 is connected in parallel with the resistor R3, and voltage at a circuit configured by a parallel circuit of the resistor R3 and the capacitor C1 is input to the overcurrent detector 4 as an input voltage Vin.

The values of the resistors R1, R2, R3 are set such that the input voltage Vin of the overcurrent detector 4 reaches a threshold voltage Vth when voltage Vds of the semiconductor element 1 increases to reach voltage at which the current flowing in a forward direction of the diode D1 disappears during conduction of the semiconductor element 1. When the input voltage Vin reaches the threshold voltage Vth, the overcurrent detector 4 detects the overcurrent and outputs the overcurrent detection signal c to the gate driving unit 3.

The voltage changing circuit 5 further includes a voltage drop controller 50. The voltage drop controller 50 includes a light emitting diode D2, a light receiving diode D3, an operational amplifier 51, and a transistor 52. The light emitting diode D2 emits light when the temperature detection signal a and a current control signal b (described later) are input from the controller 10 and when an output signal is output from the AND circuit 6.

The light emission of the light emitting diode D2 is received by the light receiving diode D3, and a drive signal is input to a gate electrode of the transistor 52 through the operational amplifier 51. A collector and an emitter of the transistor 52 are connected to the input side of the overcurrent detector 4. That is, when the temperature detection signal a and the current control signal b are input, the transistor 52 is conducted, and the input voltage Vin of the overcurrent detector 4 becomes zero. In this case, the input voltage Vin of the overcurrent detector 4 does not reach the threshold voltage Vth. Although the example in which the voltage changing circuit 5 changes the input voltage yin of the overcurrent detector 4 to zero has been described, the input voltage Vin of overcurrent detector 4 may be changed to the threshold voltage Vth or less.

The current control signal b will be described. There is a three-phase short circuit as overvoltage protection by the inverter. The three-phase short circuit is to bring all the semiconductor elements of the upper arm of each phase or all the semiconductor elements of the lower arm of each phase into the conductive state to short-circuit the windings of the motor in order to prevent the smoothing capacitor of the inverter from exceeding the withstand voltage by an induced voltage of the motor when the motor is turned by an external force although the inverter stops function. In order to maintain the three-phase short circuit, it is necessary to increase the drain-source voltage of the semiconductor element 1. However, in the case where the embodiment is not applied, the overcurrent protection is operated by the overcurrent detector 4, and the voltage between the electrodes cannot be increased. During the three-phase short circuit, a command s instructing the three-phase short circuit is input from a higher controller (not illustrated) to the controller 10, and the controller 10 receives the command s and outputs the current control signal b.

Figure 2:
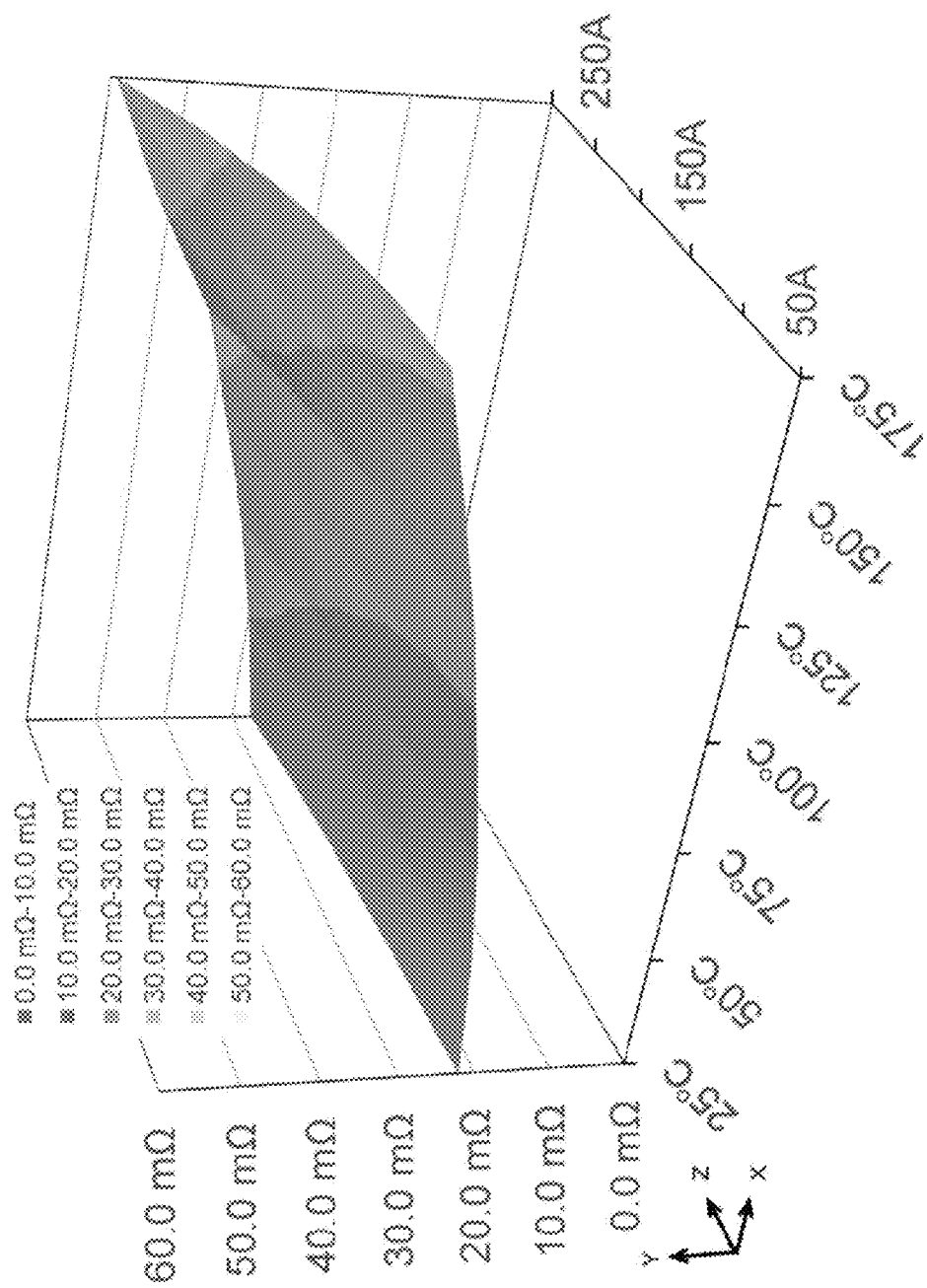
FIG. 2 is a graph illustrating a resistance value characteristic of a semiconductor element.

FIG. 2 is a graph illustrating a resistance value characteristic of the semiconductor element 1. In FIG. 2, an X-axis represents temperature, a Y-axis represents a resistance value, and a Z-axis represents a current value. As illustrated in FIG. 2, the resistance value of the semiconductor element 1 tends to increase as the temperature increases and as the current value increases.

Figure 3:
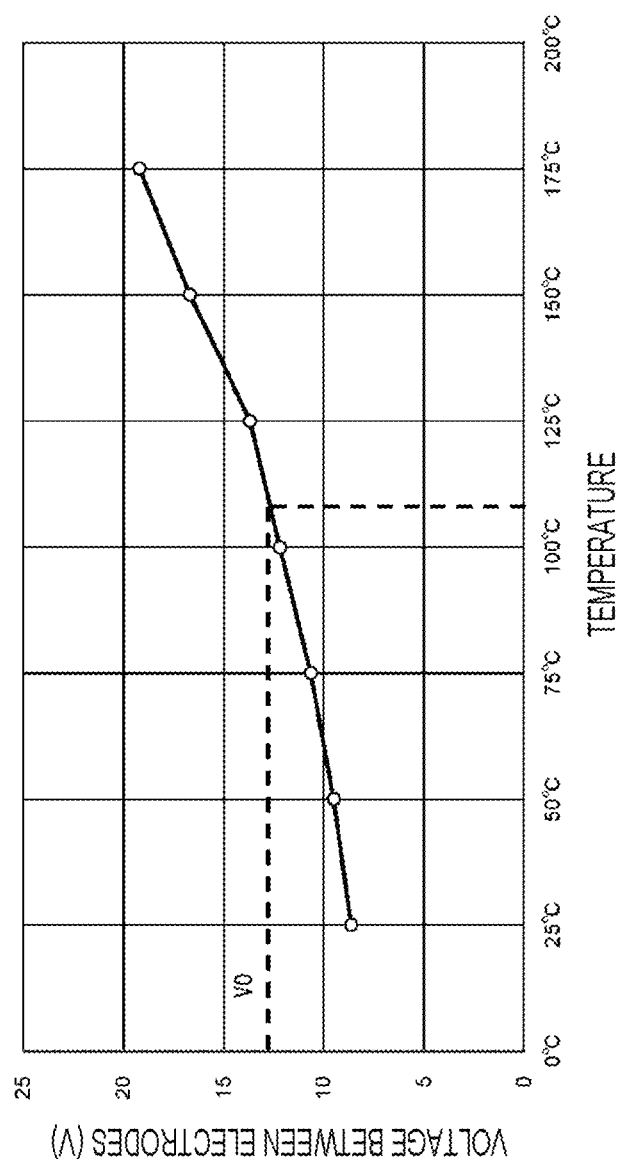
FIG. 3 is a graph illustrating an example of an increase in voltage between electrodes due to temperature.

FIG. 3 is a graph illustrating an example of an increase in voltage between the electrodes due to the temperature. In FIG. 3, the horizontal axis represents the temperature, and the vertical axis represents the voltage between the electrodes. As illustrated in FIG. 3, the semiconductor element 1 such as SiC has a characteristic that the resistance value increases during high-temperature conduction, and the voltage between the electrodes increases greatly at a large current. For example, assuming that the input voltage Vin of the overcurrent detector 4 becomes a threshold voltage Vth when the voltage between the electrodes is the detection voltage VO, the overcurrent protection is operated by the overcurrent detector 4 in the case where the embodiment is not applied when the temperature at the semiconductor element 1 increases to about 107° C.

In the embodiment, in the case where desirably the large current increases at a high temperature such as at the time of the three-phase short circuit, the temperature detection signal a and the current control signal b are output to stop unintended overcurrent protection by the overcurrent detector 4.

The operation of the load driver 100 will be described below.

FIGS. 4(A) to 4(D) are timing charts illustrating the operation of the load driver 100 when the large current not allowed, namely, when the temperature detection signal a and the current control signal b are not output.

Figure 4:
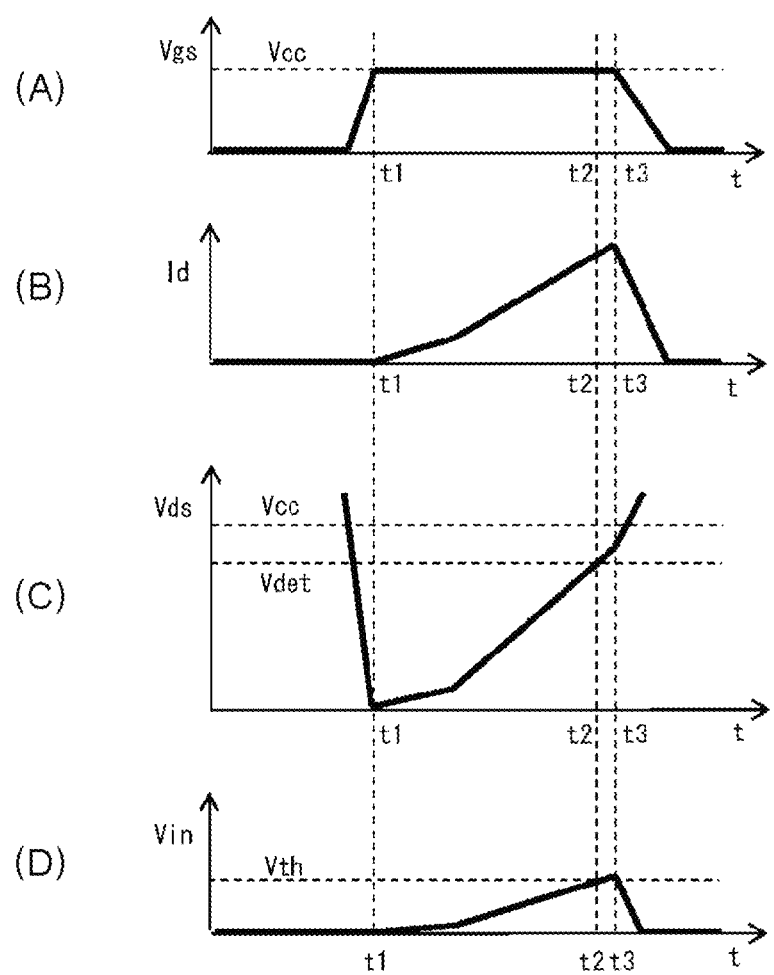
FIGS. 4(A) to 4(D) are timing charts illustrating operation of the load driver when a large current is not allowed.

FIG. 4(A) illustrates a gate-source voltage Vgs (see FIG. 1), FIG. 4(B) illustrates a drain current Ids (see FIG. 1), FIG. 4(C) illustrates a drain-source voltage Vds (see FIG. 1), and FIG. 4(D) illustrates the input voltage Vin (see FIG. 1) of the overcurrent detector 4.

In response to a PWM signal or the like from the controller 10, the gate driving unit 3 outputs the drive signal to the gate electrode of the semiconductor element 1. As illustrated in FIG. 4(A), the drive signal is applied to the semiconductor element 1 as the gate-source voltage Vgs at time t1, and the semiconductor element 1 is conducted. Then, as illustrated in FIG. 4(B), the drain current ids increases from the time t1. As illustrated in FIG. 4(C), the drain-source voltage Vds decreases at the time t1 and then gradually increases. As the drain-source voltage Vds increases, the input voltage Vin of the overcurrent detector 4 increases as illustrated in FIG. 4(D). When the input voltage Vin of the overcurrent detector 4 reaches the threshold voltage Vth at time t2, the overcurrent detector 4 detects that the input voltage Vin reaches the threshold voltage Vth, and the overcurrent detection signal c indicating the overcurrent is transmitted to the gate driving unit 3. When the forward current does not flow through the diode D1 because the drain-source voltage Vds becomes equal to voltage Vdet regarding the resistors R3, R4, the input voltage Vin of the overcurrent detector becomes the threshold voltage Vth. In response to the overcurrent detection signal c, the gate driving unit 3 stops the output of the drive signal at time t3 as illustrated in FIG. 4(A).

When the output of the drive signal is stopped at the time t3, the semiconductor element 1 is cut off. Then, as illustrated in FIG. 4(B), the drain current Ids decreases from the time t3. As illustrated in FIG. 4(C), the drain-source voltage Vds increases.

Because the semiconductor element 1 is cut off, the input voltage Vin of the overcurrent detector 4 decreases as illustrated in FIG. 4(D).

FIGS. 5(A) to 5(D) are timing charts illustrating the operation of the load driver 100 when the large current is allowed, namely, when the temperature detection signal a and the current control signal b are output.

FIG. 5(A) illustrates the gate-source voltage Vgs (see FIG. 1), FIG. 5(B) illustrates the drain current Ids (see FIG. 1), FIG. 5(C) illustrates the drain-source voltage Vds (see FIG. 1), and FIG. 5(D) illustrates the input voltage yin (see FIG. 1) of the overcurrent detector 4.

In response to a PWM signal or the like from the controller 10, the gate driving unit 3 outputs the drive signal to the gate electrode of the semiconductor element 1. As illustrated in FIG. 5(A), the drive signal is applied to the semiconductor element 1 as the gate-source voltage Vgs at the time t1, and the semiconductor element 1 is conducted. Then, as illustrated in FIG. 5(B), the drain current Ids increases from the time t1. As illustrated in FIG. 5(C), the drain-source voltage Vds decreases at the time t1 and then gradually increases. At this point, because the temperature detection signal a and the current control signal b are output from the controller 10, the light emitting diode D2 emits the light according to the output signal from the AND circuit 6. The light emission is received by the light receiving diode D3, and the transistor 52 is conducted through the operational amplifier 51, and the input voltage Yin of the overcurrent detector 4 becomes zero as illustrated in FIG. 5(D).

Consequently, as illustrated in FIG. 5(C), even when the drain-source voltage Vds increases above the voltage Vdet at the time t2, the overcurrent detector 4 does not detect the overcurrent. Therefore, the drive signal output from the gate driving unit 3 is not stopped even after the time t3.

For this reason, as illustrated in FIG. 5(B), the large current can flow in the drain current Ids. The drive signal from gate driving unit 3 stops in accordance with the stop of the output of the PWM signal or the like from the controller 10 at the end of the three-phase short circuit or the like.

According to the embodiment described above, the following effect can be obtained.

(1) The load driver 100 includes: a semiconductor element 1 disposed between electrodes through which current flows, the semiconductor element supplying the current during an on-operation and interrupting the current during an off-operation; an overcurrent detector 4 that detects that an input voltage Vin based on voltage between the electrodes is lower than or equal to a threshold voltage Vth; and a voltage changing circuit 5 that changes the input voltage Vin based on the voltage between the electrodes. The voltage changing circuit 5 changes the input voltage Vin to the threshold voltage Vth or less based on a current control signal b that allows current higher than or equal to a predetermined value in the semiconductor element 1 and a temperature detection signal a indicating that the semiconductor element 1 has temperature higher than or equal to a predetermined value. Thus, the large current can be intentionally increased at the time of the high-temperature conduction of the semiconductor element.

The present invention is not limited to the above embodiment, and other forms conceivable within the scope of the technical idea of the present invention are also included within the scope of the present invention as long as the features of the present invention are not impaired.

REFERENCE SIGNS LIST 1 semiconductor element
2 temperature detection element
3 gate driving unit
4 overcurrent detector
5 voltage changing circuit
6 AND circuit
10 controller
50 voltage drop controller
51 operational amplifier
52 transistor
100 load driver
a temperature detection signal
b current control signal
c overcurrent detection signal
s three-phase short circuit command
C1 capacitor
D1 diode
D2 light emitting diode
D3 light receiving diode
R1, R2, R3 resistor

The invention claimed is:

1. A load driver comprising:
a semiconductor element disposed between electrodes through which current flows, the semiconductor element supplying the current during an on-operation and interrupting the current during an off-operation;
an overcurrent detector that detects that an input voltage based on voltage between the electrodes is lower than or equal to a threshold voltage; and
a voltage changing circuit that changes the input voltage based on the voltage between the electrodes,
wherein the voltage changing circuit changes the input voltage to the threshold voltage or less based on a current control signal that allows current higher than or equal to a predetermined value in the semiconductor element and a temperature detection signal indicating that the semiconductor element has temperature higher than or equal to a predetermined value.

2. The load driver according to claim 1, wherein the voltage changing circuit changes the input voltage to zero based on the current control signal and the temperature detection signal.

3. The load driver according to claim 1, further comprising a controller that outputs the current control signal when a three-phase short circuit occurs in a motor.

4. The load driver according to claim 3, further comprising a temperature detection element disposed in a vicinity of the semiconductor element,
wherein the controller outputs the temperature detection signal when the temperature detected by the temperature detection element is higher than or equal to a predetermined value.

* * * * *